United States Patent [19]
Merrill et al.

[11] Patent Number: 5,886,393
[45] Date of Patent: Mar. 23, 1999

[54] BONDING WIRE INDUCTOR FOR USE IN AN INTEGRATED CIRCUIT PACKAGE AND METHOD

[75] Inventors: Richard Billings Merrill, Woodside; Inderjit Singh, San Jose, both of Calif.

[73] Assignee: National Semiconductor Corporation, Santa Clara, Calif.

[21] Appl. No.: 965,847

[22] Filed: Nov. 7, 1997

[51] Int. Cl.$^6$ .............................. H01L 23/48; H01Q 1/270
[52] U.S. Cl. ........................... 257/531; 257/691; 257/784; 257/713; 257/679; 235/491; 235/492; 342/50
[58] Field of Search ...................... 257/776, 773, 257/691, 784, 531, 679; 342/50; 235/491, 492

[56] References Cited

U.S. PATENT DOCUMENTS

| | | | |
|---|---|---|---|
| 4,554,567 | 11/1985 | Jillie et al. | 257/662 |
| 5,126,822 | 6/1992 | Salters et al. | 257/693 |
| 5,227,659 | 7/1993 | Hubbard | 257/622 |
| 5,229,639 | 7/1993 | Hansen et al. | 257/692 |
| 5,585,667 | 12/1996 | Asanasavest | 257/676 |

OTHER PUBLICATIONS

Merrill *et al.*, "Optimization of High Q Integrated Inductors for Multi–Level Metal CMOS." *IEDM 95* pp. 983–986.
Jan Craninckx and Michel S.J. Steyaert, "A 1.8 GHz CMOS Low–Phase–Noise Voltage–Controlled Oscillator with Prescaler." *IEEE Journal of Solid–State Circuits*, vol. 30, No. 12, Dec. 1995, pp. 1474–1482.

*Primary Examiner*—Peter Toby Brown
*Assistant Examiner*—Hung Van Duong
*Attorney, Agent, or Firm*—Beyer & Weaver, LLP

[57] ABSTRACT

An integrated circuit package assembly is disclosed herein and includes at least one integrated circuit chip having a plurality of chip input/output terminals, an arrangement for providing electrical communication between said input/output terminals and components external to said package, and an electrical inductor arrangement. The electrical inductor arrangement includes an origination terminal, a termination terminal, at least one intermediate connecting surface and a bonding wire positioned within the package. A first segment of the bonding wire is electrically connected with the origination terminal and a second segment is electrically connected with the termination terminal. Furthermore, the bonding wire has at least one intermediate point along it's length physically connected with one intermediate connecting surface. In one embodiment, the bonding wire is continuous along its length. At least two of the bonding wire segments extend in general directions which are non-collinear with respect to one another such that the continuous bonding wire can be electrically energized so as to function as an inductive loop.

29 Claims, 4 Drawing Sheets

BONDING WIRE INDUCTOR FOR USE IN AN INTEGRATED CIRCUIT PACKAGE AND METHOD

BACKROUND OF THE INVENTION

The present invention relates generally to inductors for use in integrated circuit packages. More specifically, the invention disclosed herein relates to an integrated circuit package assembly and to bonding wires used as part of the assembly in forming electrical inductor arrangements serving as components of the assembly.

Integrated circuit package assemblies typically include the packaging itself, at least one integrated circuit chip, integrated circuit components, some method for providing electrical communication to the integrated circuit, and bonding wires to provide electrical communication between integrated circuit components. Examples of integrated circuit components include capacitors, resistors, and, most importantly here, inductors. Inductors have important applications in many variations of communication type integrated circuits, voltage controlled oscillators being one example. It is desirable in many different circuit configurations to implement an inductor within an integrated circuit package as opposed to providing an inductor as a discrete component external to the integrated circuit package. The advantages of integrating the inductor into the integrated circuit package include minimizing the cost of, and the parasitic effects associated with, the implementation of a discrete inductor. Both advantages are particularly critical to communication type integrated circuits.

Figure 1:
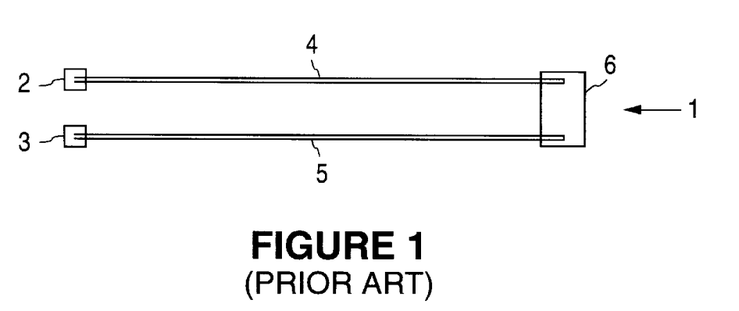
FIG. 1 is a diagrammatic view of an inductor arrangement forming part of an integrated circuit and designed in accordance with the prior art, as described above.

One method for integrating an inductor into the integrated circuit package has been disclosed in the article "A 1.8-GHz CMOS Low-Phase-Noise Voltage-Controlled Oscillator with Prescaler". Jan Craninckx and Michel S. J. Steyaert, IEEE Journal of Solid-State Circuits, Vol. 30, No. 12, December 1995. The article describes using multiple bonding wires within the integrated circuit package to form an inductor arrangement. The most basic configuration disclosed is one similar to the two-wire configuration shown in FIG. 1 and generally indicated by an electrical inductor arrangement, reference numeral 1. Referring to FIG. 1, the disclosed configuration consists of electrical inductor arrangement 1 integrated into a circuit package assembly (not shown) and forming part of an integrated circuit (not shown). Electrical inductor arrangement 1 includes an origination terminal 2, a termination terminal 3, and bonding wires 4 and 5. Bonding wires 4 and 5 are electrically connected to terminals 2 and 3, respectively, by means of a ball bond (not shown). The opposite ends of bonding wires 4 and 5 are attached to a conductive connecting strip 6 by means of stitch bonds (not shown). It should be noted specifically that the electrical inductor arrangement 1 is configured in such a manner that bonding wires 4 and 5 are parallel to each other.

The method described immediately above has several limitations. One problem is that the bonding wires define an electrical conduction path in parallel directions, and as a result, current flow is in opposite directions. The result is induced electromagnetic fields that cancel themselves and reduce the Q value for a given length of bonding wire (See Merrill, et al., "Optimization of High Q Integrated Inductors for Multi-Level Metal CMOS", IEDM, 1995). This is particularly true since the bonding wires are parallel to one another and are in close proximity to one another, due to size limitations of integrated circuits. As a second problem, the close proximity of the bonding wires also increases the probability that the wires will electrically short when the molding compound is injected during the packaging process, thereby reducing the reliability of the inductor arrangement. Additionally, connecting strip 6 is required to close the conduction path between the bonding wires, thereby greatly increasing the series resistance within the inductor arrangement, as compared to the resistance of the bonding wires, thereby further reducing the Q value. The connecting strip also increases coupling capacitance to the substrate of the integrated circuit which invariably reduces the Q value of the inductor arrangement.

It should be noted, according to the method illustrated by FIG. 1, wire 4 is described as being parallel to wire 5 and appears to be straight in the FIG. It is to be understood from FIG. 1 that the wires each have shape outside of the plane of FIG. 1, forming arched paths (not shown) from one end of each bonding wire to the other within a common plane. This is true for the prior art and, as will be seen hereinafter, is true for the present invention. Therefore, when reference is made to bonding wires and bonding wire segments being nonlinear or nonparallel, it is in reference to the specific planes in which the bonding wires and bonding wire segments are located.

As will be seen hereinafter, the present invention overcomes the problems associated with the prior art as exemplified in FIG. 1. As will be seen, the present invention provides an integrated circuit package assembly including an integrated electrical inductor arrangement that produces a relatively higher Q value and improves reliability of the inductor arrangement.

SUMMARY OF THE INVENTION

An integrated circuit package assembly, including an inductor arrangement designed in accordance with the present invention, and the inductor itself are disclosed. The integrated circuit package assembly includes at least one integrated circuit chip having a plurality of chip input/output terminals, an arrangement for providing electrical communication between the input/output terminals and components external to the package, and the inductor arrangement which, as stated, is designed in accordance with the present invention. The inductor arrangement includes an origination terminal, a termination terminal, at least one intermediate connecting surface and a bonding wire. A first segment of the bonding wire is electrically connected with the origination terminal and a second segment is electrically connected with the termination terminal. Furthermore, the bonding wire has at least one intermediate point along its length physically connected with one intermediate connecting surface. In accordance with one embodiment of the present invention, the bonding wire is continuous along its length and, at least, segments of the bonding wire extend in non-collinear directions such that the continuous bonding wire can be electrically energized so as to function as an inductive loop.

There is also disclosed a method of producing an inductor arrangement by connecting a continuous bonding wire to connecting surfaces using a combination of ball and stitch bonds. The method may utilize existing technology that is traditionally used to create bonds between bonding wire and connecting surfaces of integrated circuits and related components of the integrated circuit package.

BRIEF DESCRIPTION OF THE DRAWINGS

The present invention is best understood by reference to the detailed description given hereinafter and to the following accompanying drawings.

DETAILED DESCRIPTION OF THE INVENTION

Figure 2:
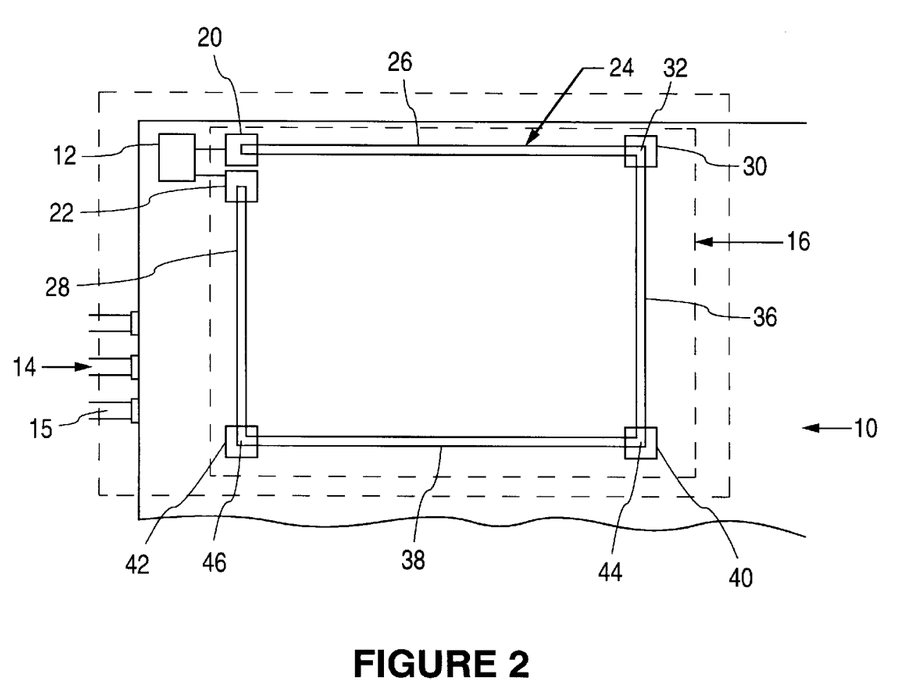
FIG. 2 is a partially broken away diagrammatic view of an integrated circuit package assembly including an electrical inductor arrangement designed in accordance with one embodiment of the present invention.

Attention is immediately directed to FIG. 2 inasmuch as FIG. 1 has already been discussed. In FIG. 2, an integrated circuit package assembly designed in accordance with the present invention and generally designated by the reference numeral 10 will be described. In this first embodiment, the integrated circuit package assembly includes packaging material (not shown), an integrated circuit chip 12 having input/output terminals (not shown), an arrangement 14 including leads 15 and conventional bonding wires (not shown) for providing electrical communication between the input/output terminals and components external to the package (not shown), and an electrical inductor arrangement 16 designed in accordance with the present invention.

Electrical inductor arrangement 16 includes an origination terminal 20 and a termination terminal 22 to provide initial and terminating connections and, according to this first embodiment, a continuous bonding wire 24 which may be identical to typical bonding wire used in integrated circuit packages. Terminals 20 and 22, as well as other terminals to be formed as part of inductor arrangement 16, may be provided as metallized pads formed in any suitable manner on one or more appropriate surfaces within the integrated circuit package. Continuous bonding wire 24 includes a first end segment 26 and a second end segment 28 that are electrically connected at their respective ends to origination terminal 20 and termination terminal 22, respectively, in a manner to be described hereinafter. In the particular embodiment illustrated, the inductor arrangement 16 includes two intermediate segments 36 and 38, such that the four segments are arranged successively from end segment 26 to intermediate segment 36 to intermediate segment 38 to end segment 28. It should be noted that according to the method disclosed, in accordance with the present invention, and in the first embodiment described in FIG. 1, and later embodiments described hereinafter, the four segments 26, 36, 38, and 28 are described as being, and appear to be, straight in FIG. 2. It is to be understood from FIG. 2 that the four segments each have shape outside of the plane of FIG. 2, forming arched paths (not shown) from one end of each segment to the other within a common plane. This is true for the prior art, as previously described and explained for the prior art depicted in FIG. 1, and is true for the present invention. Therefore, when reference is made to the wire segments being nonlinear or nonparallel with respect to one another, it is in reference to the particular planes in which the four wire segments are confined.

Furthermore, as part of electrical inductor arrangement 16, for the particular embodiment illustrated in FIG. 1, first end segment 26 extends from origination terminal 20 to an intermediate point 32 and is confined to a first plane such that intermediate segment 36 extends from intermediate point 32 and is confined to a second plane that is perpendicular to the first plane. Intermediate segment 36 extends to a second intermediate point 44 such that intermediate segment 38 extends from intermediate point 44 and is confined to a third plane that is perpendicular to the second plane. Intermediate segment 38 extends to a third intermediate point 46 such that second end segment 28 extends from intermediate point 46 to the termination terminal 22 and is confined to a fourth plane that is perpendicular to the third plane. Intermediate points 32, 44, and 46, representing junctures of the four segments 26, 36, 38, and 28, confmed by the particular planes for each segment, are physically connected to intermediate connecting surfaces 30, 40, and 42, respectively. All of the physical connections (including terminals 20 and 22) may be made in any suitable manner, for example in accordance with existing ball/stitch bonding technology. However, each successive stitch bond continues to the next stitch bond until the last stitch bond is reached at termination terminal 22. This is to be contrasted with conventional ball/stitch bond processes of the prior art in which stitch bonds do not continue. One with ordinary skill in the art can readily provide a continuous stitch bonding process in view of the teachings herein. Thus the electrical connection between the first end segment 26 at the origination terminal 20 is a ball bond, and the physical connections at intermediate points 32, 44, and 46 and the intermediate connecting surfaces 30, 40, and 42 and the termination terminal 22 are stitch bonds.

According to this first embodiment, in accordance with the present invention, it should be noted that the electrical inductor arrangement 16 has been described to include four wire segments which are configured to form a square of continuous bonding wire 24, with each angle between adjacent segments being essentially 90 degrees. It should be noted that the bonding wire segments, in accordance with the present invention, may be connected in a variety of positions so as to define other shapes such that, if the continuous bonding wire is electrically energized, the electrical inductor arrangement will function as an inductive loop. Furthermore, electrical inductor arrangement 16 has been described to include four wire segments. The present invention contemplates a minimum of two wire segments so long as the segments are confined to planes that are not coplanar and such that if the continuous bonding wire is electrically energized, the electrical inductor arrangement will function as an inductive loop.

Providing an integrated electrical inductor arrangement 16 or 56 within the integrated circuit package assembly, as depicted in FIG. 2 and, as described hereinafter, FIG. 3, allows for a conduction path that reduces the electromagnetic field interaction between bonding wire segments and, therefore, increases the inductance for a given bonding wire length. In the case of these two embodiments, the inductance is at least in part a function of the area enclosed by the inductor loop. For example, the electrical inductor arrangement 16 encloses an area approximately four times as great as the prior art, depicted in FIG. 1, given approximately equal positioning of origination and termination terminals for both inductor arrangements. A greater area, and therefore greater inductance, allows for short bonding wire length for a given inductance and lower inductor losses due to coupling capacitance with the substrate. Additionally, a square arrangement of the bonding wire path, as defined by the electrical inductor arrangement, minimizes the possibility of bonding wire short circuiting during the molding injection process required in forming the packaging and stabilizes the inductance value, making the electrical inductor arrangement more reliable. Finally, the invention discloses an electrical inductor arrangement including a bonding wire that is continuous, and as a result, there are no connecting wires or surfaces, as in the previously described prior art version, to increase the series resistance of the bonding wire and therefore lower the inductance capacity of the inductive loop. Moreover, the disclosed integrated circuit package assembly may be built using existing bonding wire equipment which can be readily modified to allow for a ball bond, combined with multiple stitch bonds, and a final ball bond in producing the electrical inductor arrangement disclosed.

Figure 3:
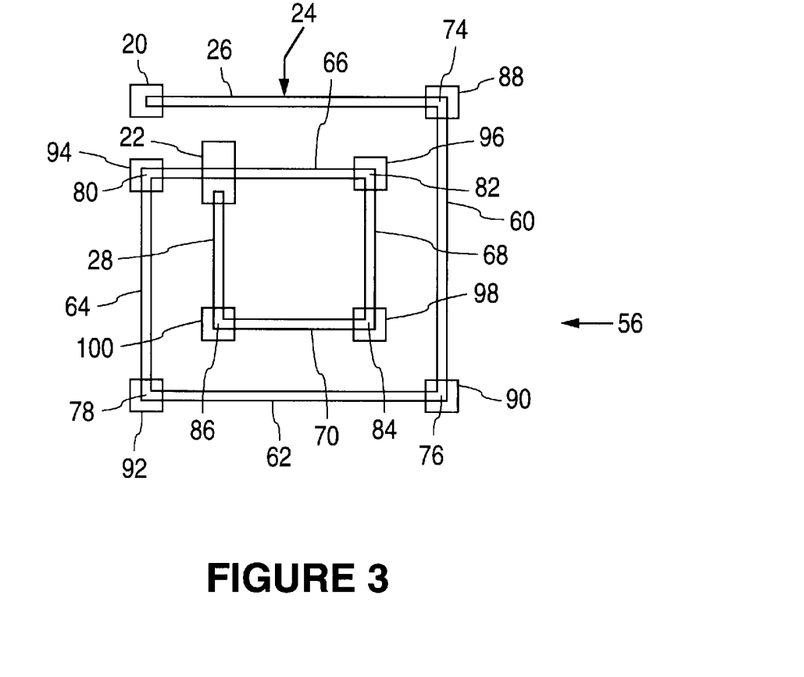
FIG. 3 is a diagrammatic view of an alternative configuration of an electrical inductor arrangement in accordance with another embodiment of the present invention.

An alternative to the rectangular configuration of electrical inductor arrangement 16, in regard to this first described embodiment, is a second embodiment, electrical inductor arrangement 56, depicted in FIG. 3. Electrical inductor arrangement 56 includes a first end segment 26, a second end segment 28, and a plurality of intermediate segments of continuous bonding wire 24, segments 60, 62, 64, 66, 68, and 70. As in the first embodiment, each segment is confined to a plane and extends to an intermediate point, depicted in FIG. 3 as intermediate points 74, 76, 78, 80, 82, 84 and 86, such that an adjacent segment extends from that intermediate point and is confined to a different plane that is perpendicular to the plane of the adjacent segment. The intermediate points, representing junctures of the wire segments, confined by the particular planes for each segment, are physically connected to intermediate connecting surfaces 88, 90, 92, 94, 96, 98, and 100. All of the physical connections may be made in any suitable manner, for example in accordance with existing ball/stitch bonding technology, as described above. In this embodiment, in accordance with the present invention, the angle between each of the adjacent segments is substantially 90 degrees, in a way which configures the electrical inductor arrangement into a spiral form. This embodiment of an electrical inductor arrangement has similar advantages in regard to integrated circuit package assemblies as described above for the first described embodiment.

Figure 4:
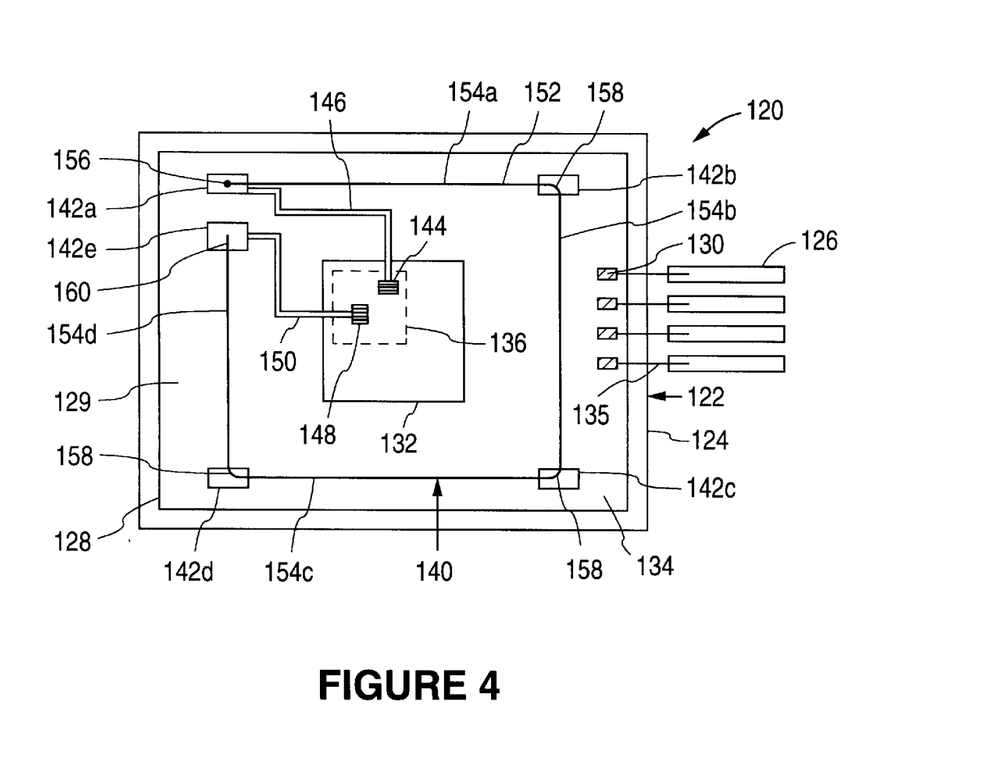
FIG. 4 is a diagrammatic plan view of an integrated circuit package assembly including an electrical inductor arrangement which is bonded directly to a surface of an IC chip in accordance with the present invention.

Another embodiment of an integrated circuit package assembly, manufactured in accordance with the present invention, is depicted in FIG. 4 and is generally indicated by the reference numeral 120. Assembly 120 includes a leadframe 122 having a die attach pad 124 and a plurality of leadframe leads 126, only selected ones of which are shown for purposes of simplicity. An IC chip 128 having an upper surface 129 is supported on die attach pad 124 in a well known manner. Chip 128 includes a plurality of chip input/output terminals 130 positioned on upper surface 129 and an active region 132 which is surrounded by an inactive region 134. Chip input/output terminals 130 are connected with leadframe leads 126 in a known manner by bonding wires 135. Active region 132 itself includes any functional block 136 of circuitry which benefits from or requires the use of an inductive component which is provided as will be described immediately hereinafter.

Still referring to FIG. 4 and in accordance with the present invention, an inductive component arrangement 140 includes bonding terminals 142a–e which are arranged on upper surface 129 of chip 128 defining a generally rectangular shape. The bonding terminals may be formed, for example, as metallized pads in conjunction with a conventional metallization process which is used to form chip input/output terminals, conductive traces to be described immediately hereinafter and similar such features. Bonding terminal 142a is connected with a chip input/output terminal 144 of active region 132 by a conductive trace 146 which is formed in a conventional manner. Similarly, bonding terminal 142e is connected with a chip input/output terminal 148 by a conductive trace 150. A continuous bonding wire 152 including segments 154a–d extends between bonding terminals 142, as shown. An initial end of bonding wire 152 is connected with bonding terminal 142a using a conventional ball bond 156. Bonding of bonding wire 152 at terminals 142b, c and d is accomplished using continuous stitch bonds 158 each of which includes a ninety degree bend. An opposing end of bonding wire 152 is connected with bonding terminal 152e using a stitch bond 160. Assembly 120 is encapsulated by a packaging material which is not shown for purposes of clarity. It should be appreciated that assembly 120 shares all of the advantages described with regard to previous embodiments in the provision of an inductive component within an integrated circuit package assembly. Furthermore, inductive component arrangement 140 is directly mounted on a surface of the IC chip in a compact, reliable and highly advantageous way.

Figure 5:
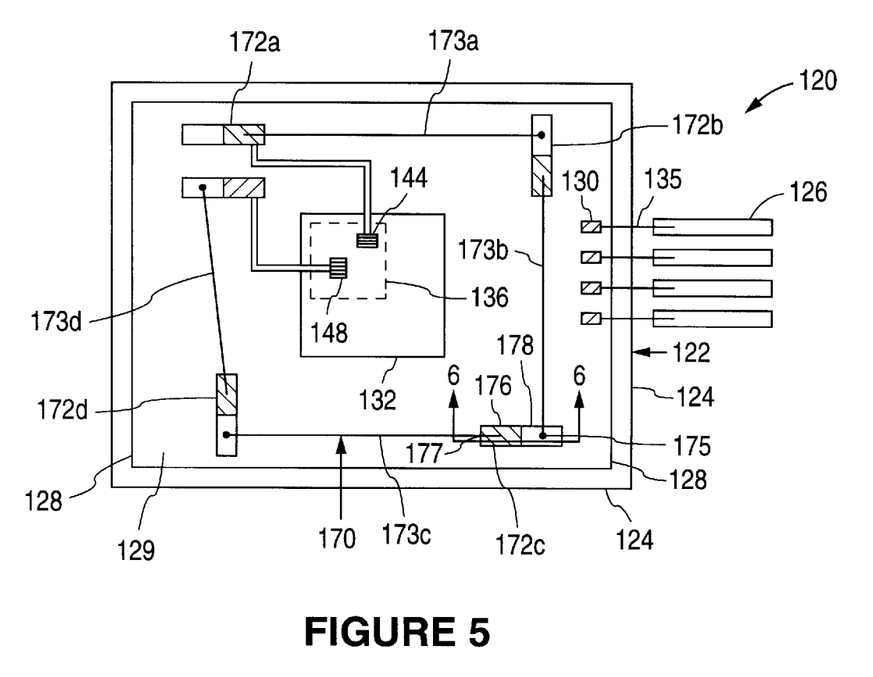
FIG. 5 is a diagrammatic plan view of an integrated circuit package assembly including an inductor arrangement which is made up of individual bonding wires connected directly to a surface of an IC chip in accordance with the present invention.
Figure 6:
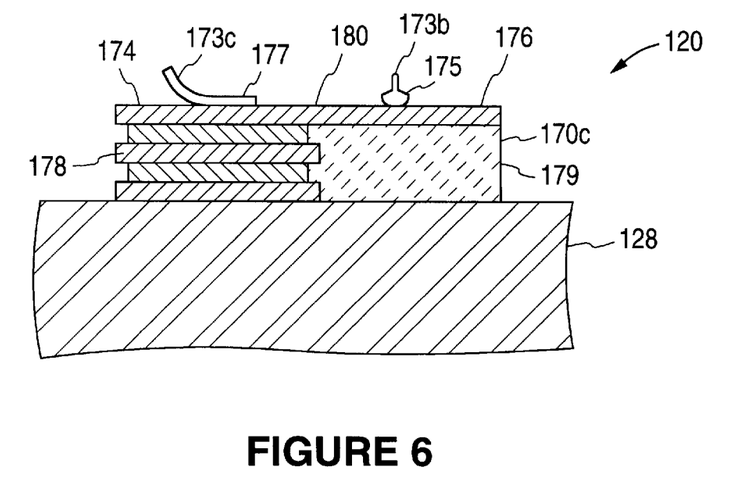
FIG. 6 is a diagrammatic elevational view, in cross-section, of a bonding terminal pad which is used in the inductor arrangement of FIG. 5, shown here to illustrate details of its construction.

Turning now to FIGS. 5 and 6, assembly 120 is repeated with the exception that an inductive component assembly 170 has been used in place of inductive component assembly 140. In certain applications such as, for example, those in which integrated circuit package assemblies are exposed to significant levels of mechanical shock or heat cycling, it may be advantageous to provide an inductive component assembly which is thought to be resistant to such problems in order to provide the highest possible reliability in such environments. To that end, inductive component assembly 170 includes a series of bonding terminal pads 172a–e having four individual bonding wires 173a–e extending therebetween, as illustrated. Details of bonding terminal pads 172 are illustrated in FIG. 6 which specifically shows pad 172c in cross-section. Pad 172c is formed in a known way using a layered structure 174 of individual metallic and oxide layers that are applied to surface 129 of IC chip 128 as part of an overall conventional metallization process which is used to form chip input/output terminals, conductive traces and similar such features. Pad 172c includes a ball bonding portion 174 with which one end of bonding wire 173b is connected by a ball bond 175 and a stitch bonding portion 176 (indicated by cross hatching in FIG. 5) with which one end of bonding wire 173c is connected by a stitch bond 177. Stitch bonding portion 176 includes a stack of metallic layers 178 which may be comprised of various alloys known in the art. Ball bonding portion 176 is comprised of an oxide region 179 including a stack of oxide layers (none of which are individually shown) which are formed in conjunction with the formation of metallic layers 178. An overall metallic layer 180 is disposed on top of both portions of the bonding pad terminal such that bonding wire electrical connections may be made directly to layer 180. As will be seen below, the configuration of bonding pad terminals 172 is highly advantageous for a number of different reasons.

Continuing to refer to FIGS. 5 and 6, it should be appreciated that bonding wires 173 are connected with bonding terminal pads 172 by first forming a ball bond at the ball bonding portion of one pad using an initial end of the bonding wire, extending the wire to its destination terminal, forming a stitch bond at the stitch bonding portion of a second pad and, finally, cutting the bonding wire. It is noted that the formation of a stitch bond is normally accompanied by considerable mechanical and/or thermal stress. In order to further improve reliability and manufacturing throughput, the use of bonding terminal pads is suggested for purposes of isolating IC chip 128 from stress associated with the formation of stitch bonds. Specifically, isolation of IC chip 128 from mechanical and thermal stress is advantageously provided as a result of the thickness of layers 178. Moreover, the fact that bends (see 90° bends 158 of FIG. 4) are not made as part of the stitch bonds used in inductor arrangement 170 may also serve to improve reliability while reducing manufacturing costs. As an additional advantage, the configuration of bonding terminal pads 172 advantageously reduces parasitic capacitance between IC chip 128 and bonding wires 173 due to the underlying oxide layers of ball bonding portion 176. It is to be understood that the present invention contemplates the use of bonding terminal pads for purposes of isolating an IC chip or other such sensitive component from mechanical and/or thermal stress in any application in which stitch bonds are applied. For example, bonding terminal pads may readily be modified (depending upon the specific type of bond or bonds to be applied) for use in inductive component arrangement 140 of FIG. 4 and in other inductive component arrangements yet to be described.

Figure 7:
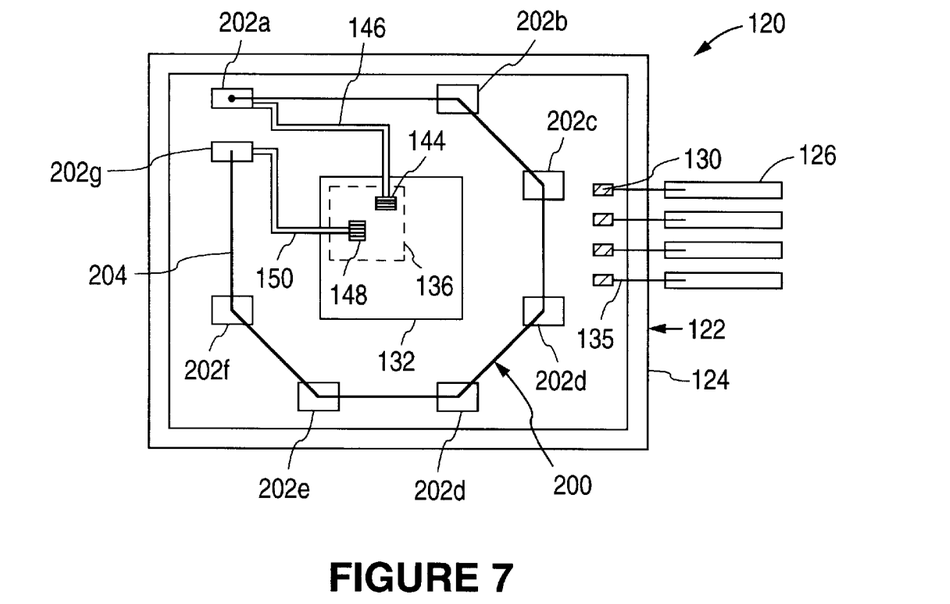
FIG. 7 is a diagrammatic plan view of an integrated circuit package assembly including an inductor arrangement which is made up of a continuous bonding wire connected directly to a surface of an IC chip in an octagonal configuration in accordance with the present invention.

Referring to FIG. 7, still another inductive component arrangement, indicated by the reference numeral 200, is shown as part of previously described assembly 120. It should be appreciated that inductive component arrangement 200 shares all of the advantages described previously with regard to arrangement 140. Moreover, inductor arrangement 200 serves to illustrate that a series of bonding terminal pads 202a, formed in any suitable manner, may be arranged defining any suitable geometric form (including multiple loops or spirals) on surface 129 of IC chip 128 (or, for that matter, any appropriate surface or surfaces within an overall IC package). In the present example, terminals 202 are arranged in the form of an octagon. A continuous bonding wire 204 is attached by means of stitch bonds to terminals 202b–g and by means of a ball bond to terminal 202a. It should be mentioned that the configuration of arrangement 200 may be advantageous, like previously described arrangement 170, with regard to improved reliability and ease of manufacturing. In this instance, the further improved reliability may be attributed to a 120° bend formed in the stitch bond at terminals 202b–g, as opposed to the 90° bend formed in the stitch bonds of arrangement 140 (FIG. 4), such that stress within the bonding wires at the stitch bonds is reduced both during and after the bonding process.

Figure 8:
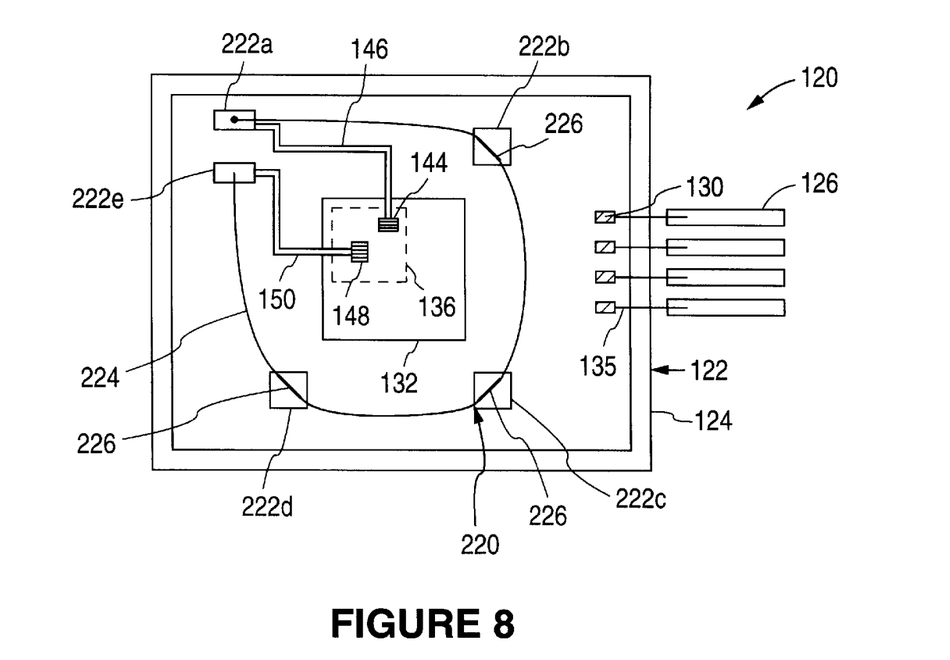
FIG. 8 is a diagrammatic plan view of an integrated circuit package assembly including an inductor arrangement which is made up of a continuous, but slightly curved bonding wire connected directly to a surface of an IC chip using one ball bond and a series of straight stitch bonds in accordance with the present invention.

Attention is now directed to FIG. 8 which illustrates yet another inductive component arrangement shown as part of previously described assembly 120, as indicated by the reference numeral 220. Like arrangement 200, arrangement 220 shares all of the advantages described previously with regard to arrangement 140. Inductor arrangement 220 includes a series of bonding terminals 222a–e, formed in any suitable manner, on surface 129 of IC chip 128. A continuous bonding wire 224 extends between the bonding terminals beginning with a ball bond on terminal 222a. Unlike previous inductor arrangements, however, stitch bonds 226 are formed on terminals 222b–e such that the direction in which each stitch bond is formed is aligned in a direction which serves to slightly curve the bonding wire between the various terminals. It should be appreciated that the configuration of stitch bonds 226 serves to eliminate the need for a bend in forming the stitch bonds through the use of a straight configuration in the bonds themselves. This configuration is, therefore, highly advantageous and heretofore unseen, at least in the formation of an inductive component arrangement.

It should be understood that an inductive component arrangement or overall integrated circuit package assembly incorporating an inductive component arrangement may be embodied in many other specific forms and produced by other methods without departing from the spirit or scope of the present invention. Therefore, the present examples are to be considered as illustrative and not restrictive, and the invention is not to be limited to the details given herein, but may be modified within the scope of the appended claims.

What is claimed is:

1. An integrated circuit package assembly, comprising:
  a) at least one integrated circuit chip having a plurality of chip input/output terminals;
  b) means for providing electrical communication between said input/output terminals and components external to said package; and
  c) an electrical inductor arrangement including an origination terminal, a termination terminal, at least one intermediate connecting surface and a continuous bonding wire positioned within said package, said bonding wire including g at least a first segment confined to a first plane and having a first end electrically connected with said origination terminal and a second segment confined to a second plane and having a second, opposite end electrically connected with said termination terminal, said bonding wire having at least one intermediate point along its length physically connected with said one intermediate connecting surface, wherein each of the wire segments making up said bonding wire is confined to a particular plane and wherein at least two wire segments extend in different planes such that said continuous bonding wire can be electrically energized so as to function as an inductive loop.

2. The integrated circuit package assembly as set forth in claim 1 wherein said first segment of said continuous bonding wire is confined to a first plane and said second segment is confined to a second plane that extends in a nonparallel direction relative to said first plane.

3. The integrated circuit package assembly as set forth in claim 1 wherein said first end and said second, opposite end of said continuous bonding wire are electrically connected respectively with said origination terminal and said termination terminal by means of a ball bond and a stitch bond, respectively, and wherein said intermediate point of said bonding wire is physically connected with said intermediate connecting surface by means of a stitch bond.

4. The integrated circuit package assembly as set forth in claim 1 wherein said continuous bonding wire includes at least said first and second segments, wherein two adjacent segments of said continuous bonding wire define a juncture and are confined to particular planes that define an angle therebetween, wherein said angle is approximately 90 degrees, and wherein said intermediate point on said continuous bonding wire is physically connected with said intermediate connecting surface at the juncture of said adjacent segments.

5. The integrated circuit package assembly as set forth in claim 4 wherein said continuous bonding wire includes a third segment and wherein one of said adjacent segments is said third segment.

6. The integrated circuit package assembly as set forth in claim 5 wherein said continuous bonding wire includes a fourth segment and wherein the other of said adjacent segments is said fourth segment.

7. The integrated circuit package assembly as set forth in claim 1 wherein said continuous bonding wire includes said first and second segments, a third segment immediately adjacent said first segment so as to define a juncture therebetween, and a fourth segment immediately adjacent and between said third segment and said second segment so as to define junctures therebetween, wherein said first and third segments are confined to planes that define an angle, wherein said third and fourth segments are confined to planes that define an angle, wherein said fourth and second segments are confined to planes that define an angle, wherein each of said angles is substantially 90 degrees, wherein said continuous bonding wire has an intermediate point for each of said junctures, wherein said electrical inductor arrangement includes an intermediate connecting surface for each of said junctures, and wherein each of said intermediate points on said continuous bonding wire is physically connected with a respective one of said intermediate connecting surfaces at an associated one of said junctures.

8. An integrated circuit package assembly, comprising:
   a) at least one integrated circuit chip having a plurality of chip input/output terminals;
   b) means for providing electrical communication between said input/output terminals and components external to said package; and
   c) an electrical inductor arrangement including an origination terminal, a termination terminal, at least one intermediate connecting surface and a bonding wire arrangement positioned within said package, said bonding wire arrangement including at least a first segment confined to a first plane and being electrically connected with said origination terminal, a second segment confined to a second plane and being electrically connected with said termination terminal, said bonding wire arrangement having at least one intermediate point physically connected with said one intermediate connecting surface, wherein each of said bonding wire segments making up said bonding wire arrangement is confined to a particular plane and wherein at least two of said bonding wire segments extend in different planes that are nonparallel relative to one another, said first and second segments being electrically connected with one another such that said bonding wire arrangement can be electrically energized so as to function as an inductive loop.

9. The integrated circuit package assembly as set forth in claim 8 wherein said bonding wire arrangement consists of a single, continuous bonding wire including said first and second segments.

10. The integrated circuit package assembly as set forth in claim 9 wherein said first segment and said second segment of said single, continuous bonding wire are electrically connected respectively with said origination terminal and said termination terminal by means of a ball bond and a stitch bond, respectively, and wherein said intermediate point of said bonding wire is physically connected with said intermediate connecting surface by means of a stitch bond.

11. An electrical inductor arrangement for use in an integrated circuit package assembly, comprising:
   a) a origination terminal, a termination terminal and at least one intermediate connecting surface; and
   b) a continuous bonding wire including at least a first segment confined to a first plane and having a first end electrically connected with said origination terminal and a second segment confined to a second plane and having a second, opposite end electrically connected with said termination terminal, said bonding wire having at least one intermediate point along it's length physically connected with said one intermediate connecting surface, wherein each of the wire segments making up said bonding wire is confined to a particular plane and wherein at least two bonding wire segments extend in different planes such that said continuous bonding wire can be electrically energized so as to function as an inductive loop.

12. The electrical inductor arrangement as set forth in claim 11 wherein said first segment of said continuous bonding wire is confined to a first plane and said second segment is confined to a second plane that extends in a nonparallel direction relative to said first plane.

13. The electrical inductor arrangement as set forth in claim 11 wherein said first end and said second, opposite end of said continuous bonding wire are electrically connected respectively with said origination terminal and said termination terminal by means of a ball bond and a stitch bond, respectively, and wherein said intermediate point of said bonding wire is physically connected with said intermediate connecting surface by means of a stitch bond.

14. The electrical inductor arrangement as set forth in claim 11 wherein said continuous bonding wire includes at least said first and second segments, wherein two adjacent segments of said continuous bonding wire define a juncture and are confined to particular planes that defined an angle therebetween, wherein said angle is approximately 90 degrees, and wherein said intermediate point on said continuous bonding wire is physically connected with said intermediate connecting surface at the juncture of said adjacent segments.

15. The electrical inductor arrangement as set forth in claim 14 wherein said continuous bonding wire includes a third segment and wherein one of said adjacent segments is said third segment.

16. The electrical inductor arrangement as set forth in claim 15 wherein said continuous bonding wire includes a fourth segment and wherein the other of said adjacent segments is said fourth segment.

17. The electrical inductor arrangement as set forth in claim 11 wherein said continuous bonding wire includes said first and second segments, a third segment immediately adjacent said first segment so as to define a juncture therebetween, and a fourth segment immediately adjacent and between said third segment and said second segment so as to define junctures therebetween, wherein said first and third segments are confined to planes that define an angle, wherein said third and fourth segments are confined to planes that define an angle, wherein said fourth and second segments are confined to planes that define an angle, wherein each of said angles is substantially 90 degrees, wherein said continuous bonding wire has an intermediate point for each of said junctures, wherein said electrical inductor arrangement includes an intermediate connecting surface for each of said junctures, and wherein each of said intermediate points on said continuous bonding wire is physically connected with a respective one of said intermediate connecting surfaces at an associated one of said junctures.

18. An electrical inductor arrangement for use in an integrated circuit package assembly, comprising:
   a) an origination terminal, a termination terminal and at least one intermediate connecting surface; and
   b) a bonding wire arrangement including at least a first segment confined to a first plane and being electrically connected with said origination terminal, a second segment confined to a second plane and being electrically connected with said termination terminal, said bonding wire arrangement having at least one intermediate point physically connected with said one intermediate connecting surface, wherein each of said bonding wire segments making up said bonding wire arrangement is confined to a particular plane and wherein at least two of said bonding wire segments extend in different planes that are nonparallel relative to one another, said first and second segments being electrically connected to one another such that said bonding wire arrangement can be electrically energized so as to function as an inductive loop.

19. The electrical inductor arrangement as set forth in claim 18 wherein said bonding wire arrangement consists of a single, continuous bonding wire including said first and second segments.

20. The integrated circuit package assembly as set forth in claim 19 wherein said first segment and said second segment of said single, continuous bonding wire are electrically connected respectively with said origination terminal and said termination terminal by means of a ball bond and a stitch bond, respectively, and wherein said intermediate point of said bonding wire is physically connected with said intermediate connecting surface by means of a stitch bond.

21. An integrated circuit package assembly, comprising:
   a) at least one integrated circuit chip having a plurality of chip input/output terminals;
   b) means for providing electrical communication between said chip input/output terminals and components external to said package; and
   c) an electrical inductor arrangement including an origination terminal, a termination terminal, at least one intermediate connecting surface and a continuous bonding wire positioned within said package, said bonding wire including at least a first segment having a first end electrically connected with said origination terminal and a second segment having a second, opposite end electrically connected with said termination terminal, said bonding wire having at least one intermediate point along its length physically connected with said one intermediate connecting surface such that said first and second segments extend in general directions which are non-collinear with respect to one another in a way which causes said continuous bonding wire to function as an inductive loop when electrically energized.

22. The integrated circuit package assembly as set forth in claim 21 wherein said integrated circuit chip includes a chip surface and wherein said origination terminal, said termination terminal, and said intermediate connecting surface are formed on said chip surface.

23. The integrated circuit package assembly as set forth in claim 21 wherein said origination and termination terminals define a distance therebetween and wherein said intermediate connecting surface is positioned such that said first and second segments are each longer than said distance.

24. The integrated circuit package assembly as set forth in claim 21 wherein said first end and said second, opposite end of said continuous bonding wire are electrically connected respectively with said origination terminal and said termination terminal by a ball bond and a stitch bond, respectively, and wherein said intermediate point of said bonding wire is physically connected with said intermediate connecting surface by a stitch bond.

25. The integrated circuit package assembly as set forth in claim 24 wherein said stitch bond on said intermediate connecting surface forms a predetermined angle which, at least in part, permits said first and second segments to be non-collinear with respect to one another.

26. An electrical inductor arrangement for use in an integrated circuit package assembly including at least one IC chip defining a chip surface, said arrangement comprising:
   a) an origination terminal, a termination terminal and at least one intermediate terminal, all of the terminals being formed on said chip surface; and
   b) a bonding wire arrangement including at least a first segment having a first end electrically connected with said origination terminal and a second segment having a second, opposite end electrically connected with said termination terminal, said bonding wire having at least one intermediate segment along its length physically connected with said one intermediate terminal such that said first and second segments extend in general directions which are non-collinear with respect to one another in a way which causes said continuous bonding wire to function as an inductive loop when electrically energized.

27. The inductor arrangement as set forth in claim 26 wherein said first end and said second, opposite end of said continuous bonding wire are electrically connected respectively with said origination terminal and said termination terminal by a ball bond and a stitch bond, respectively, and wherein said intermediate point of said bonding wire is physically connected with said intermediate terminal by a stitch bond.

28. The inductor arrangement as set forth in claim 27 wherein said stitch bond forms a predetermined angle on said intermediate terminal which, at least in part, causes said first and second segments to be non-collinear with respect to one another.

29. The inductor arrangement as set forth in claim 26 wherein said origination and termination terminals defined a distance therebetween and wherein said intermediate terminal is positioned such that said first and second segments are each longer than said distance.

* * * * *